US006821835B2

(12) United States Patent
Wilk

(10) Patent No.: US 6,821,835 B2
(45) Date of Patent: *Nov. 23, 2004

(54) CHEMICAL VAPOR DEPOSITION OF SILICATE HIGH DIELECTRIC CONSTANT MATERIALS

(75) Inventor: Glen D. Wilk, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/409,007

(22) Filed: Apr. 8, 2003

(65) Prior Publication Data

US 2003/0215995 A1 Nov. 20, 2003

Related U.S. Application Data

(63) Continuation of application No. 09/478,845, filed on Jan. 7, 2000, now Pat. No. 6,544,875.
(60) Provisional application No. 60/119,615, filed on Feb. 11, 1999, and provisional application No. 60/115,858, filed on Jan. 13, 1999.

(51) Int. Cl.$^7$ .................. H01L 21/8236; H01L 21/336; H01L 21/3205; H01L 21/4763; H01L 21/469
(52) U.S. Cl. ....................... 438/216; 438/287; 438/591; 438/785
(58) Field of Search ............................... 438/216, 287, 438/591, 785, 783

(56) References Cited

U.S. PATENT DOCUMENTS

| 4,147,615 A | 4/1979 | Leas .............................. 208/9 |
| 4,432,035 A | 2/1984 | Hsieh et al. ................. 361/322 |
| 4,464,701 A | 8/1984 | Roberts et al. ............. 361/313 |

(List continued on next page.)

FOREIGN PATENT DOCUMENTS

| JP | 5-239650 | 9/1993 | ........... C23C/16/40 |
| JP | 05239650 A | * 9/1993 | ........... C23C/16/40 |
| WO | WO 98/59366 A | 12/1998 | ......... H01L/21/285 |

OTHER PUBLICATIONS

Pierson, Handbook of Chemical Vapor Deposition, Noyes Publications: New Jersey, 1992, pp. 229–230, 232–233, 238–242.*
Leedham et al. "Liquid Injection MOCVD of Zirconium Dioxide Using a Novel Mixed Ligand Zirconium Precursor" Chemical Vapor Deposition 4(5), Oct. 1998, Abstract Only.
Wolfe, et al. "Remote Plasma Enhanced–Metal Organic Chemical Vapor Deposition of Zirconium Oxide/Silicon Oxide Alloy, (ZrO2)x–(SiO2)1–x(x<=0.5) Thin Films for Advanced High–K Gate Dielectrics" Abstract Only.
Japanese Patent Abstract for JP 11135774.
EPO Search Report—EP 1 028 458 A3.
S. Roberts, et al., "Deposition and Properties of Ultra–Thin High Dielectric Constant Insulators," 1987, ASTM Special Tech. Publ. 960 (abstract only).
U.S. patent application Appl. No. 09/115,855, filed Jul. 15, 1998.

(List continued on next page.)

*Primary Examiner*—Erik Kielin
(74) *Attorney, Agent, or Firm*—David Denker; W. James Brady, III; Frederick J. Telecky, Jr.

(57) ABSTRACT

A method of fabricating an electronic device over a semiconductor substrate, the method comprising the steps of: forming a conductive structure over the semiconductor substrate (step 106 of FIG. 1); and forming a layer of high-dielectric constant material between the conductive structure and the semiconductor substrate (step 102 of FIG. 1), the layer of high-dielectric constant material is formed by supplying a gaseous silicon source and a second gaseous material which is comprised of a material selected from the group consisting of: Hf, Zr, La, Y, Sc, Ce and any combination thereof.

25 Claims, 1 Drawing Sheet

U.S. PATENT DOCUMENTS

| | | | | |
|---|---|---|---|---|
| 4,495,219 | A | | 1/1985 | Kato et al. .................... 427/82 |
| 5,068,124 | A | | 11/1991 | Batey et al. .................. 427/39 |
| 5,384,729 | A | | 1/1995 | Sameshima ................. 365/145 |
| 5,677,015 | A | | 10/1997 | Hasegawa .................. 427/576 |
| 5,686,748 | A | | 11/1997 | Thakur et al. .............. 257/310 |
| 5,744,374 | A | | 4/1998 | Moon .......................... 437/60 |
| 5,820,664 | A | * | 10/1998 | Gardiner et al. ....... 106/287.17 |
| 5,834,357 | A | | 11/1998 | Kang ......................... 438/396 |
| 5,851,921 | A | | 12/1998 | Gardner et al. ............. 438/655 |
| 5,874,766 | A | | 2/1999 | Hori ........................... 257/411 |
| 5,907,780 | A | | 5/1999 | Gilmer et al. .............. 438/299 |
| 6,013,553 | A | | 1/2000 | Wallace et al. ............. 438/287 |
| 6,020,243 | A | | 2/2000 | Wallace et al. ............. 438/287 |
| 6,023,124 | A | | 2/2000 | Chuman et al. ............ 313/310 |
| 6,023,125 | A | | 2/2000 | Yoshikawa et al. ......... 313/310 |
| 6,063,677 | A | | 5/2000 | Rodder et al. .............. 438/300 |
| 6,066,922 | A | | 5/2000 | Iwasaki et al. ........... 315/169.3 |
| 6,086,990 | A | | 7/2000 | Sumino et al. ............. 428/336 |
| 6,127,199 | A | | 10/2000 | Inoue et al. .................. 438/30 |
| 6,130,503 | A | | 10/2000 | Negishi et al. ............. 313/495 |
| 6,144,155 | A | | 11/2000 | Yoshikawa et al. ......... 313/495 |
| 6,147,443 | A | | 11/2000 | Yoshikawa et al. ......... 313/306 |
| 6,156,672 | A | | 12/2000 | Koshido et al. ............ 438/778 |
| 6,291,283 | B1 | | 9/2001 | Wilk .......................... 438/216 |
| 6,291,866 | B1 | | 9/2001 | Wallace et al. ............. 257/410 |
| 6,291,867 | B1 | | 9/2001 | Wallace et al. ............. 257/410 |
| 6,468,856 | B2 | | 10/2002 | Wallace et al. ............. 438/240 |
| 6,544,875 | B1 | * | 4/2003 | Wilk .......................... 438/591 |

OTHER PUBLICATIONS

U.S. patent application Appl. No. 09/116,138, filed Jul. 15, 1998.

U.S. patent application Appl. No. 09/396,289, filed Sep. 15, 1999.

U.S. patent application Appl. No. 09/396,642, filed Sep. 15, 1999.

* cited by examiner

CHEMICAL VAPOR DEPOSITION OF SILICATE HIGH DIELECTRIC CONSTANT MATERIALS

This application is a continuation of Appl. No. 09/478,845, filed Jan. 7, 2000 now U.S. Pat. No. 6,544,875, which claims priority from Appl. No. 60/115,858, filed Jan. 13, 1999 and Appl. No. 60/119,615, filed Feb. 11, 1999.

CROSS-REFERENCE TO RELATED PATENT/PATENT APPLICATIONS

The following commonly assigned patent/patent applications are hereby incorporated herein by reference:

| U.S. Pat. No. /Ser. No. | Filing Date |
| --- | --- |
| 09/116,138 | Jul. 15, 1998 |
| 09/396,289 | Sep. 15, 1999 |
| 09/957,503 | Oct. 24, 1997 |
| 09/396,642 | Sep. 15, 1999 |
| 09/436,895 | Nov. 09, 1999. |

FIELD OF THE INVENTION

The instant invention pertains to semiconductor device fabrication and processing and more specifically to a method of fabricating a higher dielectric constant material using a silicate.

BACKGROUND OF THE INVENTION

The trend in semiconductor device processing is to make the devices smaller so that more devices can be fabricated in a given area. This scale down affects substantially all of the device, so that each feature is scaled down. This is particularly problematic for the gate structure and capacitors, because capacitance is proportional to the dielectric constant of the material situated between the two plates of the capacitor and effective area of the dielectric material. In addition, the capacitance of a structure is inversely proportional to the distance between the two electrodes of the structure. Currently, since $SiO_2$ is the material of choice for gate dielectrics, the thickness of this layer is decreased to compensate for the scaling down of the area of the capacitor. However, this thinning of the oxide layer is becoming problematic for a couple of reasons. First, as the thickness of the silicon dioxide layer is decreased to below about 3 nm, the leakage through the oxide becomes unacceptably high. In addition, the oxide layer ceases to act as an effective barrier with regards to keeping dopants which are implanted into the gate electrode to increase the conductivity of the gate electrode out of the channel regions. Second, extremely thin layers, unless they are formed from a process which is self-limiting, are very difficult to reproducibly fabricate. Third, any etching away of a thin layer, especially a gate insulator, using subsequent processing to etch other structures affects the thinner layer more dramatically than it would a thicker layer because a greater percentage of the thinner layer is removed than that of a thicker layer.

Another approach to solve this problem involves changing the gate insulating material to one with a higher dielectric constant. For example, BST, PZT, $TiO_2$ and $Ta_2O_5$ are being considered for the next generation of gate dielectrics. However, each of these materials pose problems because the processing required to make these materials into effective gate dielectric materials conflicts with the processing of standard transistor structures. More specifically, each of these materials generally require a high temperature anneal in an oxygen-containing ambient, and this anneal can greatly degrade the underlying substrate and any other exposed oxidizable structures.

Hence a new material needs to be used which is relatively easy to process using standard gate structure processing techniques and which has a dielectric constant higher than that of silicon dioxide ($\epsilon \approx 3.9$).

SUMMARY OF THE INVENTION

Basically, the instant invention involves a gate structure which includes an oxide or a silicate layer as the gate dielectric and a method for fabricating such a structure using chemical vapor deposition (CVD). More specifically, the gate insulator of the instant invention is preferably comprised of $ZrSiO_x$ or $HfSiO_x$ (where 0<x<4), or even $ZrO_2$ or $HfO_2$. Preferably, this layer has a dielectric constant of around 10 to 40 (more preferably around 15 to 30). In alternative embodiments, the dielectric layer of the instant invention can be utilized as a capacitor dielectric.

A method of fabricating an electronic device over a semiconductor substrate, the method comprising the steps of: forming a conductive structure over the semiconductor substrate; and forming a layer of high-dielectric constant material between the conductive structure and the semiconductor substrate, the layer of high-dielectric constant material is formed by supplying a gaseous silicon source and a second gaseous material which is comprised of a material selected from the group consisting of: Hf, Zr, La, Y, Sc, Ce and any combination thereof. In an alternative embodiment, a gaseous oxygen source is also supplied. The method of instant invention may also include the step of: subjecting the electronic device to between 600 and 900 C in an ambient. Preferably, the ambient of the anneal step is comprised of: $O_2$, $O_3$, $N_2$, $H_2$, $NH_3$, and any combination thereof. The gaseous silicon source is, preferably, comprised of: silane, disilane, dichlorosilane, and any combination thereof, and may also include a carrier gas (preferably comprised of: He, $N_2$, Ar, and Ne). Preferably, the second gaseous material is comprised of: $Zr(OC_4H_9)_4$, $Hf(OC_4H_9)_4$, $Zr(NO_3)_4$, $Hf(NO_3)_4$, $ZrCl_4$, $HfCl_4$, $ZrI_4$, $HfCl_4$, $ZrBr_4$, $HfBr_4$, $Zr_2(OPri)_6(tmhd)_2 Hf_2(OPri)_6(tmhd)_2$, and any combination thereof. The electronic device may be a capacitor or a transistor. Another embodiment of the instant invention is a method of fabricating a high-dielectric constant material over a semiconductor substrate, the method comprising the steps of: providing a gaseous silicon source in a chamber; providing a second gaseous source in the chamber, the second gaseous source comprised of a material selected from the group consisting of: Hf, Zr, La, Y, Sc, Ce and any combination thereof. The method of the instant invention may further comprise the step of: subjecting the high-dielectric constant material to between 600 and 900 C in an ambient. Preferably, the anneal ambient is comprised of: $O_2$, $O_3$, $N_2$, $H_2$, $NH_3$, and any combination thereof. The gaseous silicon source is, preferably, comprised of: silane, disilane, dichlorosilane, and any combination thereof, and may include a carrier gas (preferably comprised of: He, —$N_2$, Ar, and Ne). Preferably, the material is comprised of: $Zr(OC_4H_9)_4$, $Hf(OC_4H_9)_4$, $Zr(NO_3)_4$, $Hf(NO_3)_4$, $ZrCl_4$, $HfCl_4$, $ZrI_4$, $HfI_4$, $ZrBr_4$, $HfBr_4$, $Zr_2(OPri)_6(tmhd)_2$, $Hf_2(OPri)_6(tmhd)_2$, and any combination thereof. The second gaseous source may include a source of oxygen.

BRIEF DESCRIPTION OF THE DRAWINGS

Like reference numerals in the different figures represent like or similar features. Features illustrated in the figures are not necessarily to scale.

DETAILED DESCRIPTION OF THE DRAWINGS

Figure 1:
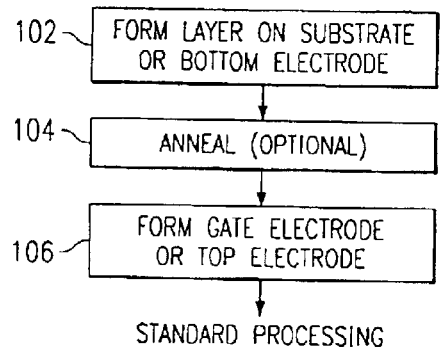
FIG. 1 is a flow diagram illustrating the method of one embodiment of the instant invention.

While the following description of the instant invention is centered around the methodology of FIG. 1 and the device structure of FIGS. 2a–2d, the instant invention can be used with a metal gate or any other type of gate structure and it can be fabricated using a disposable gate (as illustrated in the cases incorporated by reference) or using the standard process flow as is shown. The dielectric layer of the instant invention may also be used as the gate dielectric in a disposable gate structure process flow as is illustrated in co-pending U.S. patent application Ser. No. 09/396,642 (assigned to TI and docketed as TI-24776P), which is herein incorporated by reference. In addition, the methodology of the instant invention and the dielectric layer formed, thereby, can be used as the dielectric between two electrodes of a capacitor.

Figure 2A:
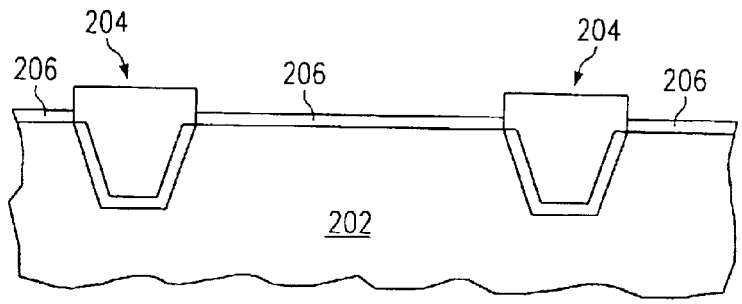
FIGS. 2a–2c are cross-sectional views of a partially fabricated device which is processed using the method of the instant invention as is illustrated in FIG. 1.
Figure 2B:
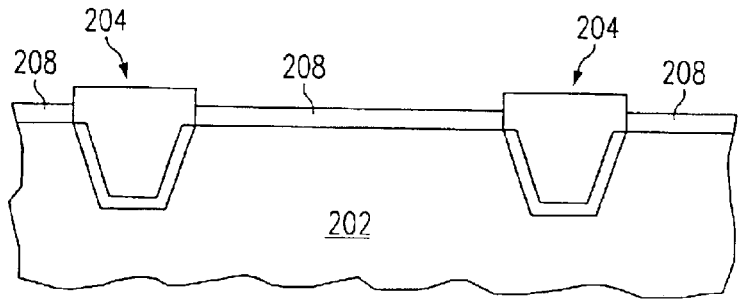
Figure 2C:
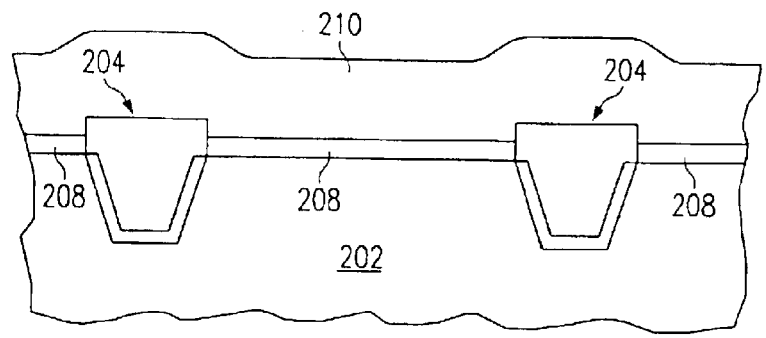

Prior processing may be performed prior to the method of the instant invention. This prior processing may include cleaning the surface of the wafer 202, formation of isolation areas 204, and doping of portions of the wafer. Isolation structures 204 are illustrated in FIGS. 2a–c as shallow trench isolation structures (STI) but any type of isolation structure may be used. Examples of isolation structures include, LOCOS, STI, and junction isolation structures.

In most standard processing regimes a thin oxide is grown on the wafer prior to the formation of the isolation structure and implanting of the substrate dopants. If a thin oxide layer is used it would, preferably, be removed prior to step 102. Preferably, the removal of the thin oxide layer is accomplished in an oxide etch, or deglaze, step. This process will, preferably, include subjecting the wafer to an HF solution so as to remove the protective oxide while not substantially affecting isolation structure 204.

Referring to step 102 of FIG. 1 and FIG. 2a, a layer 206 is blanketly formed over substrate 202. In step 102, layer 206 may not be formed on isolation structure (shown in FIG. 2a), preferably by a masking operation, it may be selectively removed from isolation structure 204, or it may be formed on isolation structure 204 (not shown) and left there. Preferably, layer 206 will be comprised of a transition metal (such as Hf, Zr, La, Y, Sc, and/or Ce), silicon (if layer 208 is to be a silicate) and potentially oxygen and/or nitrogen. Preferably layer 206 will be comprised of $HfSiO_x$, $ZrSiO_x$, $LaSiO_x$, $YSiO_x$, $ScSiO_x$, $CeSiO_x$, Hf, $HfSi_2$, Zr, $ZrSi_2$, La, $LaSi_x$, Y, $YSi_x$, Sc, $ScSi_x$, Ce, or $CeSi_x$, and is preferably on the order of 4 to 10 nm thick (more preferably around 4 to 6 nm thick). Using the method of the instant invention, layer 206 is formed using chemical vapor deposition. Several embodiments of the instant invention can be used to form the silicate layer of the instant invention.

In each of the following embodiments, the symbol M is used to designate Hf or Zr or other such metal which have the desired properties similar to Hf and Zr for this application (such as La, Y, Sc or Ce listed above). Each of these embodiments utilize a precursor which is either combined with a carrier gas (which may be comprised of He, nitrogen, argon, neon, or any combination of the above) or not. Preferably, the precursors of the embodiments of the instant invention are comprised with a metal source, M, a silicon source (preferably silane, disilane, and/or dichlorosilane), and possibly even a source of oxygen and/or nitrogen. The source of oxygen can be $O_2$, $O_3$ or other oxygen source, such as a plasma source. If a source of oxygen and/or nitrogen is not provided in the precursor, anneal step 104 can be performed so as to incorporate oxygen and/or nitrogen into layer 206.

In one embodiment of the instant invention, a combination of $M(NO_3)_4$ in gaseous form is provided into a chamber along with silane, or disilane or dichliorosilane, (along with a carrier gas—preferably around 10% of this gas mixture) in gaseous form. Preferably, the flow rate of $M(NO_3)_4$ is around 5 to 20 sccm (more preferably around 10 sccm) and the flow rate of the silane (and carrier gas) is around 1 to 20 sccm (more preferably around 1 to 10 sccm). The ambient temperature of the chamber is around 60 to 120 C (more preferably around 70 C). An advantage of this precursor of the instant invention is that it is carbon-free and it is less likely to form excess water.

In another embodiment of the instant invention, a combination of metal t-butoxide, $M(OC_4H_9)_4$, (preferably along with a carrier gas) in gaseous form is provided into a chamber along with silane (preferably along with a carrier gas—preferably around 10% of the carrier gas and 90% silane) in gaseous form. Preferably, the flow rate of $M(OC_4H_9)_4$ is around 5 to 15 sccm (more preferably around 10 sccm) and the flow rate of the silane (and carrier gas) is around 1 to 20 sccm (more preferably around 1 to 10 sccm). Disilane or dichlorosilane can be used in place of the silane. The ambient temperature of the chamber is preferably around 60 to 120 C (more preferably around 70 C).

In another embodiment of the instant invention, the gaseous metal source may be comprised of $MCl_4$, $MI_4$, or $MBr_4$. The gaseous silicon source may be comprised of silane, disilane, or dichlorosilane and may further comprise a carrier gas such as He, Ar, $N_2$, or Ne. Additionally, a gaseous oxygen source (such as $O_2$ or $O_3$) may be included or a subsequent anneal in an oxygen or ozone ambient may be performed (such as in optional anneal step 104). Since chlorine and bromine are very reactive, and since chlorine is corrosive, if either of these gases are used, a non-stainless steel reactor (preferably a quartz reactor) should be used.

In another embodiment of the instant invention, the gaseous metal source is comprised of $M_2(OPri)_6(tmhd)_2$ and the silicon source is preferably comprised of silane, disilane, or dichlorosilane. An oxygen source may be used or an anneal in an oxygen or ozone ambient may be performed (such as in step 104).

Referring to step 104 of FIG. 1 and FIG. 2b, an anneal is performed next, if at all, so as to improve the electrical properties of layer 206, which contains a combination of silicon and the transition metal, or more preferably to improve the quality of already existing silicate layer. For example, if layer 206 is comprised of Hf, $HfSi_2$, Zr, or $ZrSi_2$ it would become $HfO_x$, $HfSiO_x$, $ZrO_x$, or $ZrSiO_x$, respectively, or more preferably if the layer is already $HfSiO_x$, an anneal step in forming gas (preferably using 90% $N_2$:10% $H_2$) will remove the defects in the silicate film, thereby improving the electrical properties of the layer. Alternatively, an anneal in an oxygen-containing ambient will increase the oxygen content of the silicate by increasing the x value. Preferably, anneal step 104 is either performed: in an 90% $N_2$:10% $H_2$ ambient at a temperature around 350 to 500 C (more preferably around 450 C) for around 10 to 30 minutes (more preferably 30 minutes); in an $O_2$ ambient at a temperature around 400 to 900 C (more preferably around 800 C) for around 15 to 60 seconds (preferably around 30 seconds); in an $O_3$ ambient at a temperature around 25 to 400 C; or in an $N_2$ or $NH_3$ ambient at a temperature around 500 to 600 C. Other temperature and ambient combinations may be used but these seem to give the best results. Preferably, layer 206 is subjected to this elevated temperature in an oxygen-containing and/or nitrogen-containing atmosphere for a period of between 10 and 120 seconds (more preferably around 20 to 45 seconds—even more preferably around 30 seconds) in anneal step 104.

Referring to step 106 of FIG. 1 and to FIG. 2c, a conductive gate electrode layer 210 is formed. Preferably, layer 210 is comprised of polycrystalline silicon, polycrystalline silicon germanium, doped polycrystalline silicon, doped polycrystalline silicon germanium, tungsten, titanium, tungsten nitride, titanium nitride, platinum, aluminum, a combination thereof or a stack comprised of one or more of the above. Layer 210 is preferably formed using standard semiconductor processing steps and is of a thickness which is commonly used in standard transistor formation.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a transistor gate dielectric over a semiconductor substrate, the method comprising:

forming a gate dielectric on the semiconductor substrate, the gate dielectric comprising a dielectric selected from the group consisting of $ZrSiO_x$, $HfSiO_x$, and mixtures thereof, wherein $0<x<4$;

wherein the gate dielectric is formed by supplying a gaseous silicon source and a second gaseous material which comprises a metal, wherein the metal is selected from the group consisting of: Hf, Zr, and combinations thereof.

2. A method of fabricating a transistor gate dielectric over a semiconductor substrate, the method comprising:

forming a gate dielectric on the semiconductor substrate, the gate dielectric comprising a dielectric selected from the group consisting of $ZrSiO_x$, $HfSiO_x$, and mixtures thereof, wherein $0<x<4$;

wherein the gate dielectric is formed by supplying a gaseous silicon source and a second gaseous material which comprises a metal, wherein the metal is selected from the group consisting of: Hf, Zr, and combinations thereof; and forming a conductive gate over the gate dielectric.

3. The method of claim 1, wherein the gate dielectric is formed by also supplying a gaseous oxygen source.

4. The method of claim 1, further comprising the step of: subjecting the gate dielectric to between 600 and 900 C in an ambient.

5. The method of claim 4, wherein the ambient is comprised of a gas selected from the group consisting of: $O_2$, $O_3$, $N_2$, $H_2NH_3$, and any combination thereof.

6. The method of claim 2, the gaseous silicon source is comprised of a gas selected from the group consisting of: silane, disilane, dichlorosilane, and any combination thereof.

7. The method of claim 6, wherein the gaseous silicon source includes a carrier gas.

8. The method of claim 7, wherein the carrier gas is comprised of a gas selected from the group consisting He N2, AR, and Ne.

9. The method of claim 2, wherein the second gaseous material is comprised of a gas consisting of: $Zr(OC_4H_9)_4$, $Hf(OC_4H_9)_4$, $Zr(NO_3)_4$, $Hf(NO_3)_4$, $ZrCl_4$, $HfCl_4$, $ZrI_4$, $HfI_4$, $ZrBr_4$, $HfBr_4$, $Zr_2(OPri)_6(tmhd)_2$, $Hf_2(OPri)_6(tmhd)_2$, and any combination thereof.

10. The method of claim 2, wherein the second gaseous material is substantially $ZrCl_4$.

11. The method of claim 2, wherein the second gaseous material is substantially $HfCl_4$.

12. The method of claim 2, wherein the second gaseous material is substantially $Zr_2(OPri)_6(tmhd)_2$.

13. The method of claim 2, wherein the second gaseous material is substantially $Hf_2(OPri)_6(tmhd)_2$.

14. The method of claim 2, wherein the second gaseous material is substantially $Zr(OC_4H_9)_4$.

15. The method of claim 2, wherein the second gaseous material is substantially $Hf(OC_4H_9)_4$.

16. The method of claim 2, wherein the gaseous silicon source is silane.

17. The method of claim 2, wherein the gaseous silicon source is dichliorosilane.

18. The method of claim 3, wherein the second gaseous material is substantially $ZrCl_4$.

19. The method of claim 3, wherein the second gaseous material is substantially $HfCl_4$.

20. The method of claim 3, wherein the second gaseous material is substantially $Zr_2(OPri)_6(tmhd)_2$.

21. The method of claim 3, wherein the second gaseous material is substantially $Hf_2(OPri)_6(tmhd)_2$.

22. The method of claim 3, wherein the second gaseous material is substantially $Zr(OC_4H_9)_4$.

23. The method of claim 3, wherein the second gaseous material is substantially $Hf(OC_4H_9)_4$.

24. The method of claim 3, wherein the gaseous silicon source is substantially silane.

25. The method of claim 3, wherein the gaseous silicon source is substantially dichliorosilane.

* * * * *